United States Patent [19]

Gergis

[11] Patent Number: 4,900,367
[45] Date of Patent: Feb. 13, 1990

[54] METHOD OF MAKING A RETICULATED TEMPERATURE SENSITIVE IMAGING DEVICE

[75] Inventor: Isoris S. Gergis, Thousand Oaks, Calif.

[73] Assignee: Rockwell International, El Segundo, Calif.

[21] Appl. No.: 266,174

[22] Filed: Nov. 2, 1988

Related U.S. Application Data

[62] Division of Ser. No. 892,539, Aug. 1, 1986, abandoned.

[51] Int. Cl.$^4$ ............................................. H01L 35/34
[52] U.S. Cl. ..................................... 136/201; 136/213
[58] Field of Search .................. 136/201, 213; 250/332

[56] References Cited

U.S. PATENT DOCUMENTS

| | | | |
|---|---|---|---|
| 4,259,866 | 4/1981 | Sleighter | 136/213 X |
| 4,451,690 | 5/1984 | Ishida | 136/201 |
| 4,593,456 | 6/1986 | Cheung | 136/201 X |
| 4,598,163 | 7/1986 | Ito | 136/213 |
| 4,648,991 | 3/1987 | Fang et al. | 136/213 X |

*Primary Examiner*—Peter A. Nelson
*Attorney, Agent, or Firm*—H. Frederick Hamann; John J. Deinken

[57] ABSTRACT

A fully reticulated pyroelectric imager is made by affixing a first major surface of a layer of poled pyroelectric material to a substrate and polishing a second major surface of the pyroelectric layer to reduce the layer to a predetermined thickness. An electrically conductive electrode layer is deposited on the second major surface of the pyroelectric layer and portions of the electrode layer are selectively removed to define a two dimensional array of front side electrodes on the pyroelectric layer. Portions of the pyroelectric layer are then selectively removed to define a two dimensional array of pyroelectric detector elements on the substrate, with one of the front side electrodes on the second major surface of each detector element. A polymer layer is deposited over the arrays of front side electrodes and detector elements and a portion of the polymer layer is selectively removing over each front side electrode to create a via to each front side electrode. A two dimensional array of electrically conductive pads is deposited on the polymer layer such that each pad contacts a front side electrode through the corresponding via. The detector element array is mated to a multiplexer chip by connecting each pad on the detector array to circuitry on the multiplexer chip and the substrate is removed. An electrically conductive radiation absorbing layer is then deposited on the first major surface of each pyroelectric detector element.

6 Claims, 6 Drawing Sheets

METHOD OF MAKING A RETICULATED TEMPERATURE SENSITIVE IMAGING DEVICE

GOVERNMENT RIGHTS

The U.S. Government has rights in this invention pursuant to a contract awarded by the Defense Advanced Research Projects Agency.

CROSS REFERENCE TO RELATED APPLICATIONS

This is a division of application Ser. No. 892,539, filed Aug. 1, 1986, and now abandoned.

BACKGROUND OF THE INVENTION

This invention relates to pyroelectric detector arrays for sensing electromagnetic radiation.

Radiation detectors can generally be divided into two broad categories, according to the nature of the energy detected. Quantum or photon detectors respond to discrete excitations caused by the action of individual photons. Thermal detectors, such as pyroelectric, bolometer, or thermoelectric junction devices, are sensitive to changes in the temperature of the detector material caused by the absorption of energy for incoming radiation. This absorption of the radiant energy may be direct, by adsorption within the detector material itself, or indirect, through absorption in some auxiliary structure which conducts the heat to the detector material.

Pyroelectric detectors utilize the spontaneous electrical polarization of a pyroelectric material. This polarization results from the anharmonic ionic vibrations which are possible in pyroelectric crystals. When the temperature of a pyroelectric material changes, the temperature change alters the spontaneous polarization of the material which, in turn, causes an electrical surface charge to flow. This surface charge can be measured and related to the intensity of the incoming radiation.

In order to achieve high sensitivity, the active element of a pyroelectric detector should have a small thermal mass, because a smaller mass will change temperature in response to absorbed radiation more quickly than a larger mass, leading to a faster and more sensitive detector. In addition, the active element of the detector should be thermally isolated from its surroundings to ensure a high temperature variation for a given amount of absorbed radiation. These two requirements, however, are difficult to satisfy simultaneously.

Minimizing the detector mass usually involves thinning the detector material, but thinner layers of pyroelectric material are more fragile and therefore require more substantial support structures. Additional support structures, however, conflict with the need for maximum thermal isolation, since a minimal amount of support is desirable for reduced heat transfer from the detector. Ideally, a pyroelectric detector would be totally isolated from its surroundings so that thermal losses from the detector would occur only by radiation. In practice, however, some provision for mounting the detector to a substrate is required, and heat diffusion into the substrate degrades the responsivity of the detector.

These design constraints are further complicated when multiple pyroelectric detectors are incorporated into a focal plan array, where the scene to be viewed is optically focussed on a two dimensional matrix of detector elements so that each detector images a particular portion of the scene. The array of detectors in interconnected to an integrated circuit chip (multiplexer) which provides signal gathering and processing functions. Each detector is connected to an input circuit on the multiplexer chip. The use of focal planes has become particularly desirable in the field of infrared imaging with the advent of improved signal processing techniques and photolithographic processes which make possible the fabrication of high density infrared systems employing a large number of detectors per unit area.

Although focal plane research has in the past concentrated on photovolatic detector designs, the need for cryogenic cooling for such detectors has led to the consideration of thermal detectors for use in medium performance applications. Thermal detectors do not require cooling and, as a consequence, are inherently simpler in design than photovoltaic detectors, resulting in weight savings, reduced power consumption, and lower costs. In addition, thermal detectors are uniformly sensitive over a wide range of the infrared spectrum and exhibit a nearly constant signal to noise ratio over a large frequency range. The problems involved in fabricating a pyroelectric detector with high thermal responsivity and isolation, however, are further exacerbated when an array of thin detectors must be fabricated and integrated with an interconnect structure exhibiting high thermal isolation.

Consequently, a pyroelectric detector array exhibiting superior thermal isolation for relatively thin detectors without sacrificing the physical integrity of the detector structure would be an important contribution to the art in the thermal imaging field.

SUMMARY OF THE INVENTION

A fully reticulated pyroelectric detector array is fabricated by affixing a first major surface of a layer of poled pyroelectric material to a substrate. An electrically conductive electrode layer is deposited on the second major surface of the pyroelectric layer and selected portions of the electrode layer are removed to define a two dimensional array of front side electrodes on the pyroelectric layer. Portions of the pyroelectric layer are then selectively removed to define a two dimensional array of pyroelectric detector elements on the substrate, with one of the front side electrodes disposed on the second major surface of each detector element. A polymer layer is deposited over the arrays of front side electrodes and detector elements and the substrate is removed.

In a more particular embodiment, after the pyroelectric material has been affixed to the substrate, the second major surface of the pyroelectric layer is polished to reduce the layer to a predetermined thickness. The method may also include selectively removing a portion of the polymer layer over each front side electrode to create a via to each electrode and depositing a two dimensional array of electrically conductive pads on the polymer layer such that each pad contacts a front side electrode through the corresponding via. In addition, an electrically conductive radiation absorbing layer may be deposited on the first major surface of each pyroelectric detector element.

A fully reticulated pyroelectric imager is made by the steps of affixing a first major surface of a layer of poled pyroelectric material to a substrate and polishing a second major surface of the pyroelectric layer to reduce the layer to a predetermined thickness. An electrically conductive electrode layer is deposited on the second major surface of the pyroelectric layer and portions of the electrode layer are removed to define a two dimensional array of front side electrodes on the pyroelectric layer. Portions of the pyroelectric layer are then removed to define a two dimensional array of pyroelectric detector elements on the substrate, with one of the front side electrodes on the second major surface of each detector element. A polymer layer is deposited over the arrays of front side electrodes and detector elements and a portion of the polymer layer is removed over each front side electrode to create a via to each front side electrode. A two dimensional array of electrically conductive pads is deposited on the polymer layer such that each pad contacts a front side electrode through the corresponding via. The detector element array is mated to a multiplexer chip by connecting each pad on the detector to circuitry on the multiplexer chip. The substrate is then removed and an electrically conductive radiation absorbing layer is deposited on the first major surface of each pyroelectric detector element.

A fully reticulated pyroelectric detector array constructed according to this invention includes a two dimensional array of poled pyroelectric detector elements, an electrically conductive front side electrode disposed on a second major surface of each detector element, and a polymer layer disposed over the front side electrodes and the detector element array to provide structural support for the detector element array.

A fully reticulated pyroelectric imager constructed according to this invention includes a detector array, with a two dimensional array of poled pyroelectric detector elements, an electrically conductive radiation absorbing layer disposed on a first major surface of each detector element, an electrically conductive front side electrode disposed on a second major surface of each detector element, a polymer layer disposed over the front side electrodes and the detector element array to provide structural support and thermal isolation for the detector array, a via through the polymer layer to each front side electrode, and a two dimensional array of electrically conductive pads on the polymer layer with each pad contacting a front side electrode through the corresponding via. A multiplexer chip provides signal processing functions for the detector array. An array of electrically conducting columns connects the detector array to the multiplexer chip, each column being affixed to one of the interconnects and to associated processing circuitry on the multiplexer chip.

DESCRIPTION OF THE INVENTION

Figure 1:
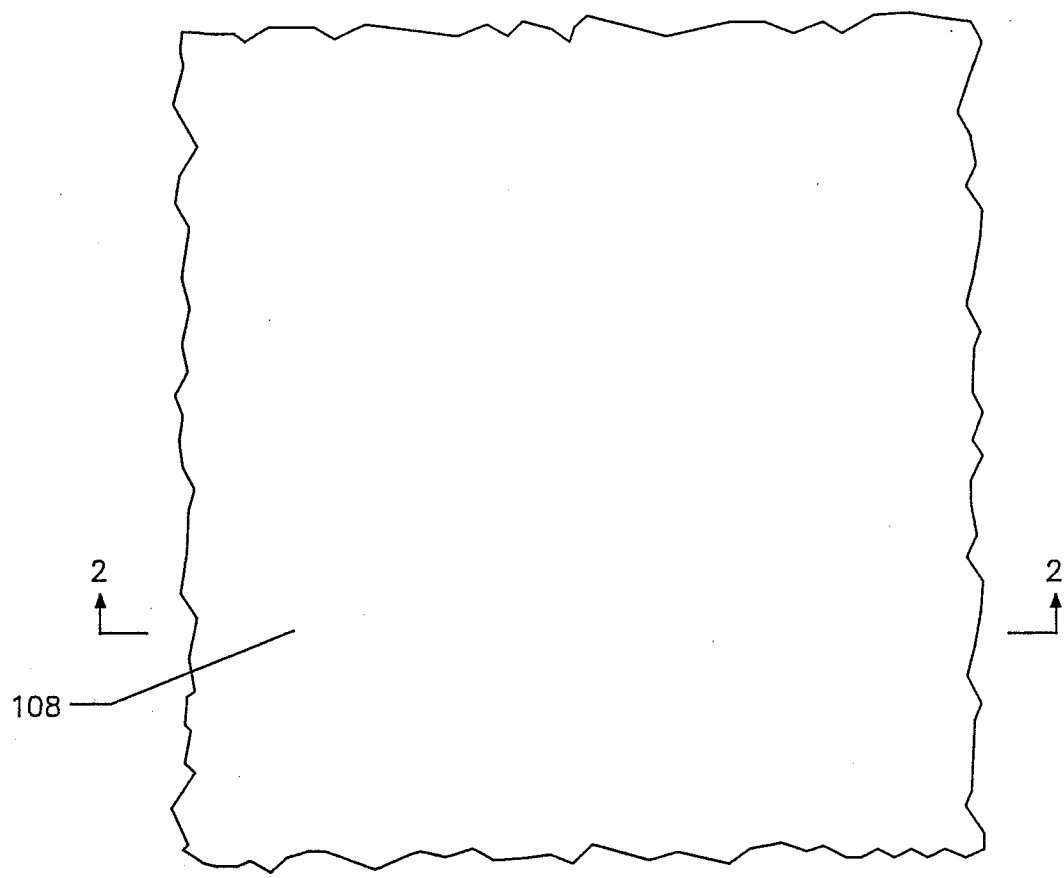
FIGS. 1, 3, 5, and 7 are plan views depicting a pyroelectric detector array constructed according to the present invention at different stages of the fabrication process, FIGS. 2, 4, 6, and 8 each provide a cross-sectional view of the array at the stages shown in FIGS. 1, 3, 5, and 7, respectively.

It is an outstanding feature of this invention to provide a pyroelectric detector array with high responsivity and superior thermal isolation. In this invention, most of the processing steps involved in fabricating the array are performed while the array is supported on a solid substrate. This approach is especially advantageous because it permits the use of standard microfabrication techniques in much the same way as with semiconductor wafer processing. After processing is complete, the substrate is removed, yielding a detector array with high thermal isolation and improved responsivity.

One technique which can be used to fabricate a pyroelectric detector array according to this invention is illustrated in FIGS. 1-8. In the embodiment illustrated, each detector is fabricated as a capacitor, with the dielectric being the pyroelectric material, which has its pyroelectric axis normal to the electroded surfaces. FIGS. 1, 3, 5, and 7 are plan views depicting the array at different stages of the fabrication process, while FIGS. 2, 4, 6, and 8 each provide a cross-sectional view of the array along the line indicated on the respective plan view. As those skilled in the art will appreciate, the drawings depict only a small portion of an actual array in order to most effectively illustrate the invention. For the same reason, some of the dimensions in the drawings may be exaggerated relative to other dimensions.

Figure 2:
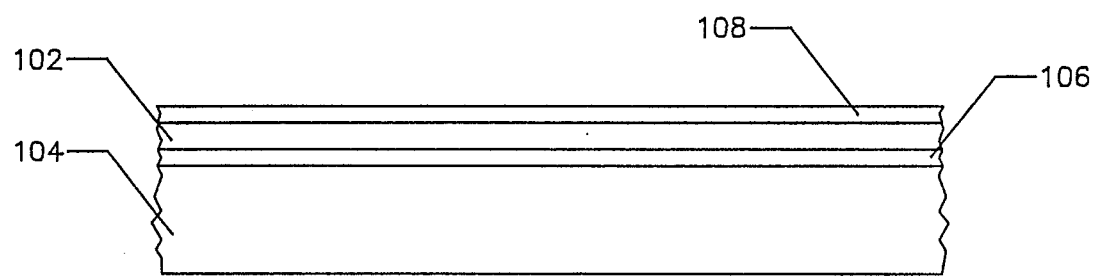

As shown in FIGS. 1 and 2, the process begins with a pyroelectric plate 102 which has previously been poled. The plate is polished on one side to optical flatness. The optically flat side of the plate is then mounted on an optically flat surface of a disposable substrate wafer 104 with an adhesive 106. The substrate material is chosen so that the substrate can subsequently be etched off without affecting the integrity of the completed array. After mounting on the substrate, the plate 102 is thinned down to the desired thickness, using a combination of mechanical polishing and ion beam milling. Because of the structural support provided by the attached substrate and the support provided by a polymer layer in the completed detector, as is explained below, the plate may be thinned to as little as 2.5 $\mu$m over an area of 1.5×1.5 cm, with a thickness uniformity of + or −0.25 $\mu$m.

Figure 3:
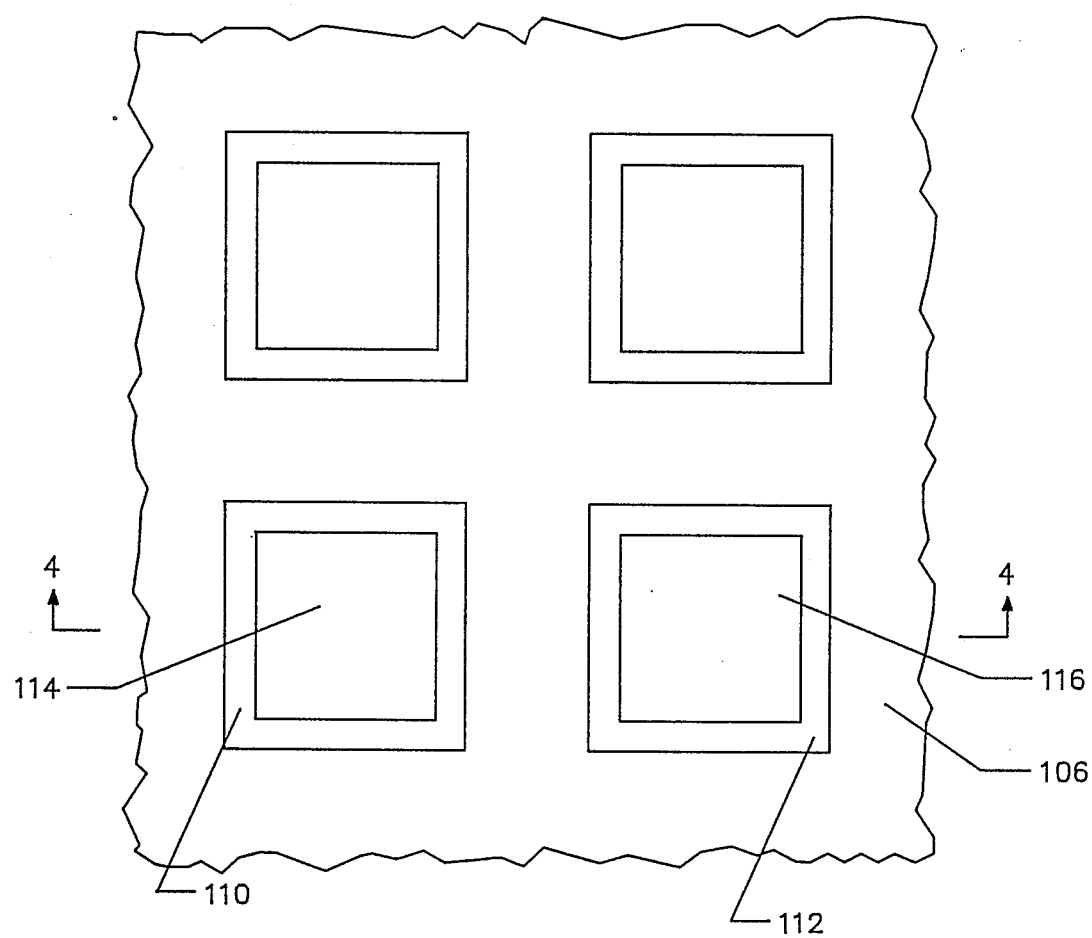
Figure 4:
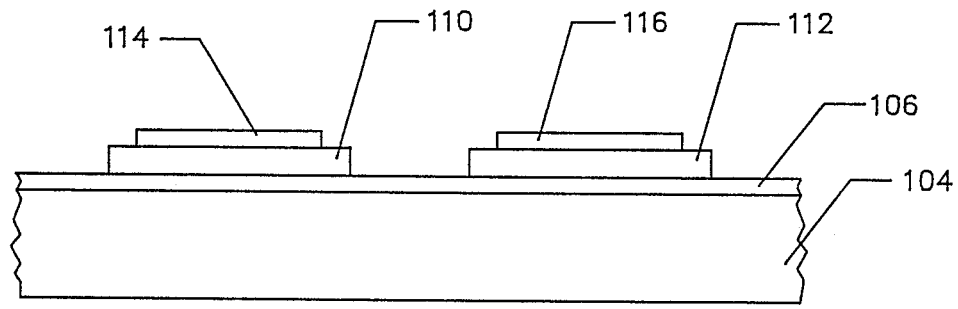

A thin layer of metal 108 is then deposited on the thinned pyroelectric plate and photolithographic masks are applied to the assembly. As shown in FIGS. 3 and 4, the pyroelectric plate 102 and the metallic layer 108 are then reticulated, by chemical etching or ion milling, to delineate a two dimensional array of pyroelectric detector elements, including the elements 110 and 112, and a two dimensional array of front side electrodes, such as the electrodes 114 and 116, with one electrode contacting each detector element.

Figure 5:
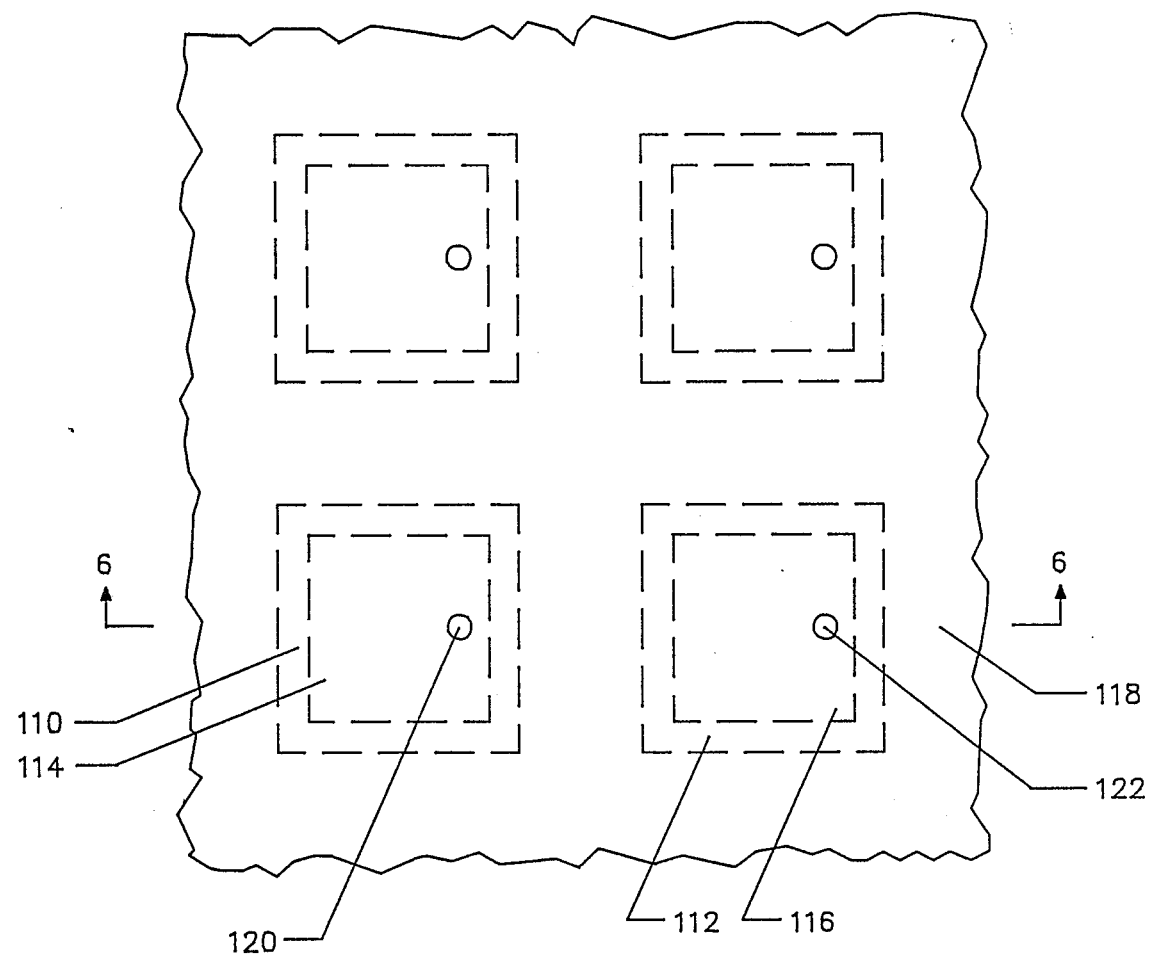
Figure 6:
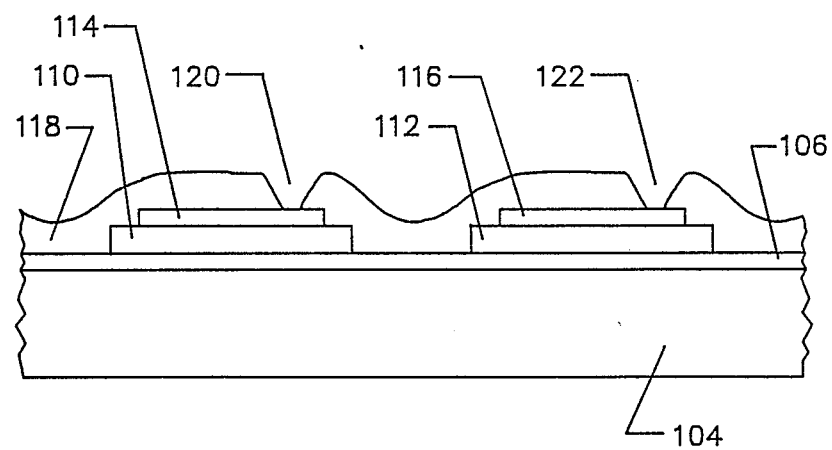

Proceeding to FIGS. 5 and 6, a polymer layer 118 is then deposited over the array of front side electrodes and detector elements. The properties of the polymer and the method of deposition are very important for this application. The polymer should be flexible and display adequate tensile strength, while it should also be resistant to the solvents and etchants which are used in the device processing steps. The method used to deposit the polymer layer should be suitable for forming thin layers.

Next, vias, such as the vias 120 and 122, are established through the polymer layer to the front side electrodes. A photoresist layer having a larger thickness than the polymer layer is used as a mask in this step. The formation of vias in an organic polymer can be accomplished using an oxygen plasma. The etching should be isotropic to produce the sloped sidewall necessary for good step coverage. This step may be performed in a barrel etcher, where the energy of the ions is relatively low.

Figure 7:
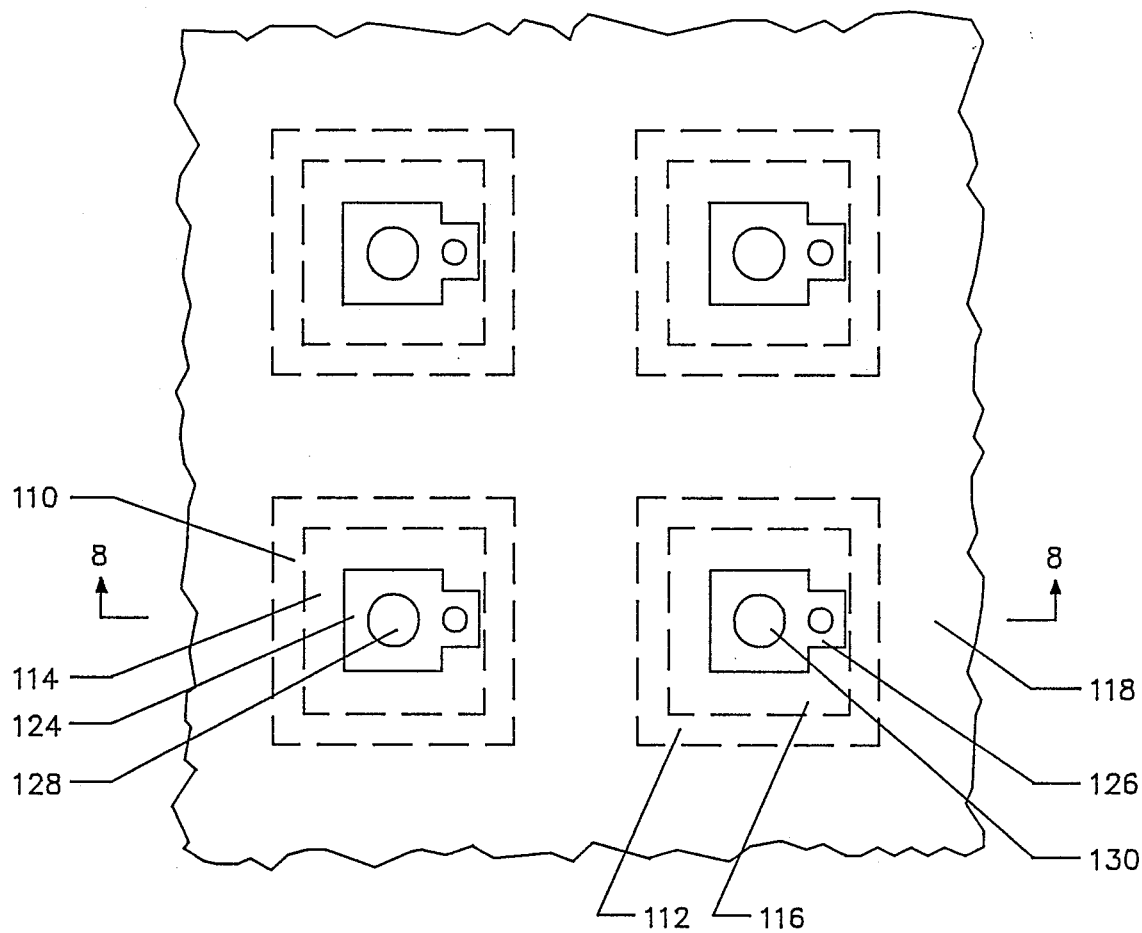
Figure 8:
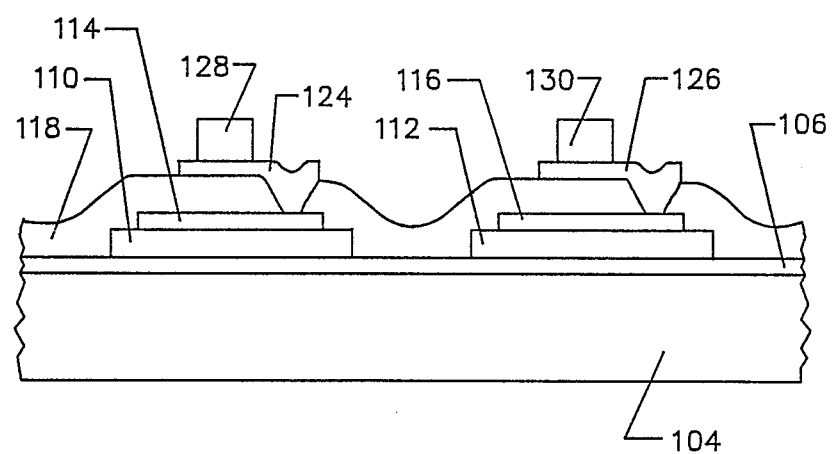

Proceeding to FIGS. 7 and 8, a photolithographic mask is applied over the polymer layer and a two dimensional array of contact pads, including the contact pads 124 and 126, is deposited, with each pad being deposited on the polymer layer and extending into a via to electrically connect with one of the front side electrodes.

The pad metal must be thick enough to provide good step coverage of the via side walls and to prevent breakage at the bottom edges of the vias. Excessively thick pad metal, however, should be avoided since it would be detrimental to the thermal isolation of the detector. A double layer metal film, with a thick layer of a highly conductive metal and a thin layer of a high strength metal, can be used to satisfy both requirements. First, the pad mask is used to deposit both layers. Then another mask is used to cover the area over the vias and the highly conductive layer is etched off in the flat region of the pads, leaving the bottom thin metal to provide electrical connection and only a weak thermal conductance between the detector and its surroundings.

Figure 9:
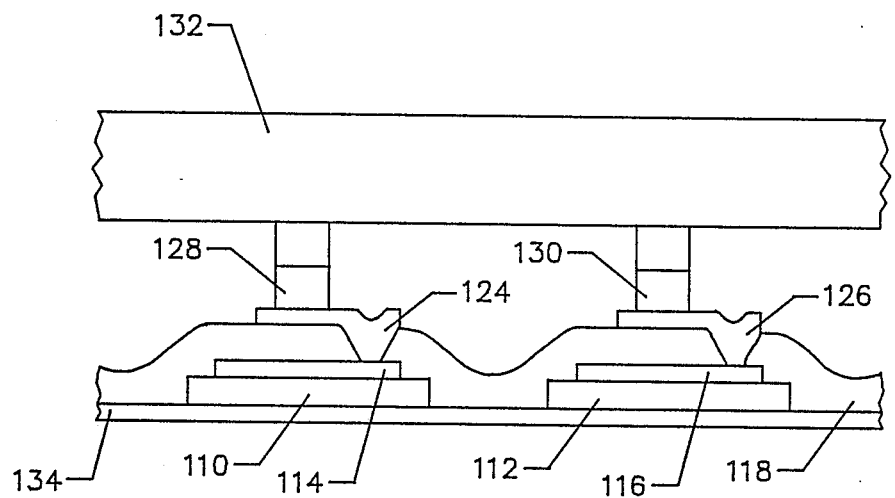
FIG. 9 is a cross sectional view showing how the detector array of FIGS. 1-8 is mated to a multiplexer chip, and FIGS. 10 and 11, which are analogous to FIGS. 7 and 8, illustrate an alternative embodiment of the detector array in which the indium columns are located in between the detectors.

Next, a two dimensional array of soft metal indium columns, including the columns 128 and 130, is deposited on the contact pad array. The indium columns are deposited by evaporation of indium and a lift off process. The completed pyroelectric array wafer is then diced to separate it into individual arrays. Multiplexer wafers are similarly prepared with an array of corresponding indium columns and diced. As shown in FIG. 9, each detector array is then mated to a multiplexer chip 132 by cold welding the matching indium columns, similar to the process which is used in fabricating HgCdTe hybrid devices.

The disposable substrate is then removed by etching it off in a suitable etchant. The space between the array and the multiplexer chip is sealed to protect the multiplexer chip and the indium columns from the etchant. A radiation absorbing backside ground plane 134 is then deposited on the array. A shadow mask is used to protect the hybrid device outside the active area.

This invention provides a detector architecture in which the detector elements are completely separated from each other and are cast in a thin polymer matrix. The polymer matrix functions both to hold the array together and as a substrate for the indium bumps and other interconnect metallization. The thickness of the polymer film is determined by considering the thermal isolation it provides between the indium columns and the detector, and the thermal load it adds to the detector. The film is made thick enough to provide a rugged structure, yet sufficiently thin that the detector elements are not thermally overloaded. Because the detector elements are separated from each other, the consequences of fracture are greatly reduced, since any fracture which does occur will not propagate further than one element. Another advantage of this technique is that the thermal conductivity of most polymers is much smaller than that of the detector material. Consequently, with a judicious layout of the interconnect leads and the indium columns, thermal conductance between the active detector elements and the multiplexer chip can be greatly reduced.

Figure 10:
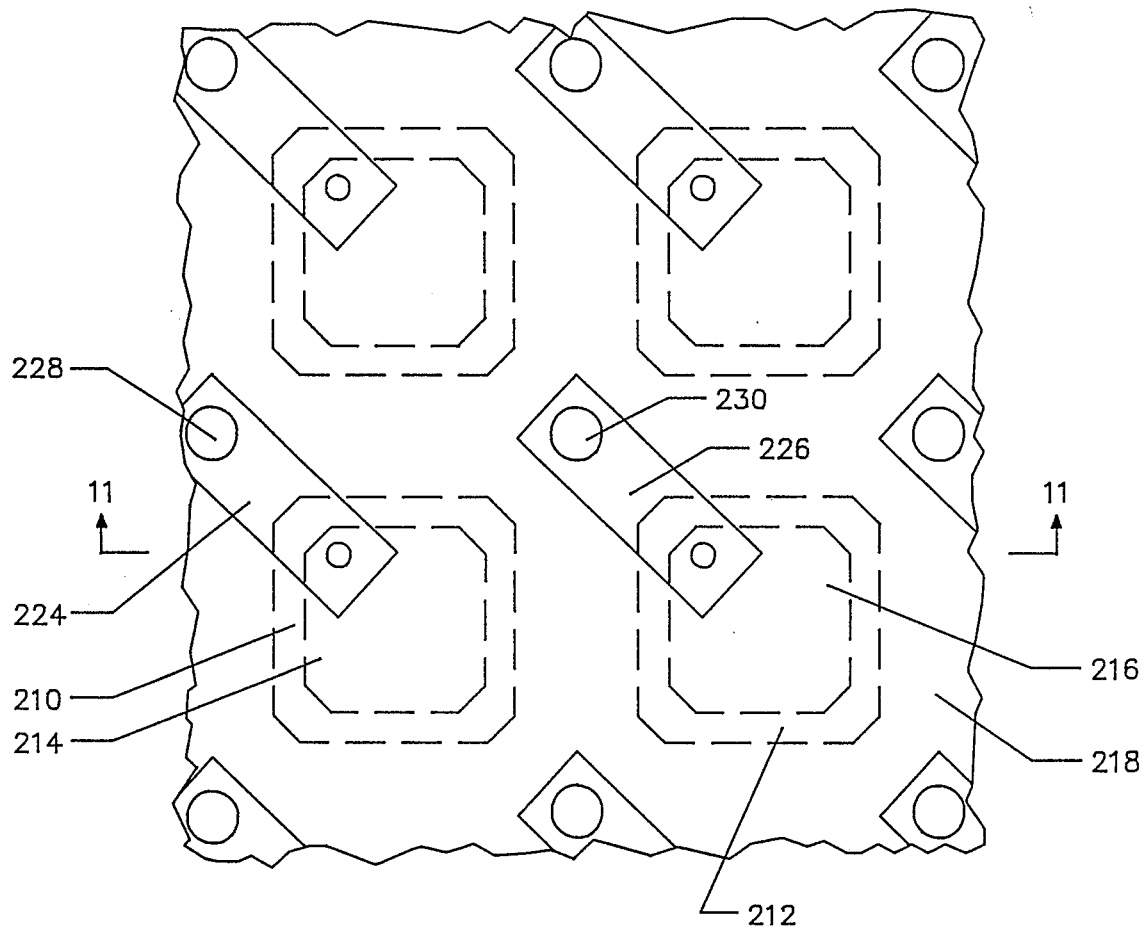
Figure 11:
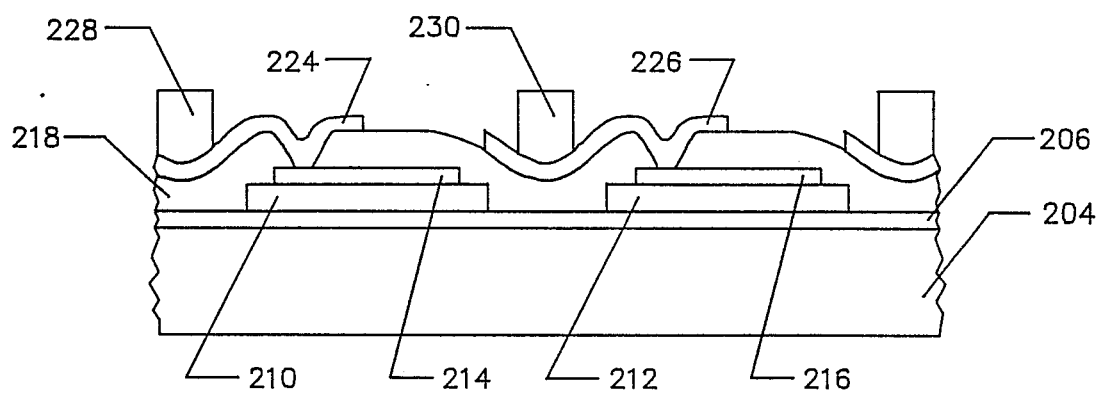

In the embodiment illustrated in FIGS. 1-9, the polymer layer provides a relatively large thermal resistance between the detectors and the indium columns. Another effective method of isolation is to locate the indium columns in between the detectors, as shown in the embodiment illustrated in FIGS. 10 and 11, which are analogous to FIGS. 7 and 8. Here the thermal conduction path through the polymer can be made much longer than the polymer thickness. Furthermore, thermal conduction through the interconnecting lines can be made very small by using very thin, low thermal conduction metals such as titanium or some other conductive materials.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

I claim:

1. A method of making a fully reticulated pyroelectric detector array, comprising the steps of:
    affixing a first major surface of a layer of poled pyroelectric material to a substrate;
    depositing an electrically conductive electrode layer on a second major surface of the pyroelectric layer;
    selectively removing portions of the electrode layer to define a two dimensional array of front side electrodes on the pyroelectric layer;
    selectively removing portions of the pyroelectric layer to define a two dimensional array of pyroelectric detector elements on the substrate, with one of the front side electrodes disposed on the second major surface of each detector element;
    depositing a polymer layer over the arrays of front side electrodes and detector elements; and
    removing the substrate.

2. The method of claim 1, further comprising, after the step of affixing the pyroelectric material to the substrate, the step of polishing the second major surface of the pyroelectric layer to reduce the layer to a predetermined thickness.

3. The method of claim 1, further comprising the steps of:
    selectively removing a portion of the polymer layer over each front side electrode to create a via to each front side electrode; and
    depositing a two dimensional array of electrically conductive pads on the polymer layer such that each pad contacts a front side electrode through the corresponding via.

4. The method of claim 1, further comprising the step of depositing an electrically conductive radiation absorbing layer on the first major surface of each pyroelectric detector element.

5. A method of making a fully reticulated pyroelectric detector array, comprising the steps of:
    affixing a first major surface of a layer of poled pyroelectric material to a substrate;

polishing a second major surface of the pyroelectric layer to reduce the layer to a predetermined thickness;

depositing an electrically conductive electrode layer on the second major surface of the pyroelectric layer;

selectively removing portions of the electrode layer to define a two dimensional array of front side electrodes on the pyroelectric layer;

selectively removing portions of the pyroelectric layer to define a two dimensional array of pyroelectric detector elements on the substrate, with one of the front side electrodes disposed on the second major surface of each detector element;

depositing a polymer layer over the arrays of front side electrodes and detector elements;

selectively removing a portion of the polymer layer over each front side electrode to create a via to each front side electrode;

removing the substrate; and depositing an electrically conductive radiation absorbing layer on the first major surface of each pyroelectric detector element.

6. A method of making a fully reticulated pyroelectric imager, comprising the steps of:

affixing a first major surface of a layer of poled pyroelectric material to a substrate;

polishing a second major surface of the pyroelectric layer to reduce the layer to a predetermined thickness;

depositing an electrically conductive electrode layer on the second major surface of the pyroelectric layer;

selectively removing portions of the electrode layer to define a two dimensional array of front side electrodes on the pyroelectric layer;

selectively removing portions of the pyroelectric layer to define a two dimensional array of pyroelectric detector elements on the substrate, with one of the front side electrodes on the second major surface of each detector element;

depositing a polymer layer over the arrays of front side electrodes and detector elements;

selectively removing a portion of the polymer layer over each front side electrode to create a via to each front side electrode;

depositing a two dimensional array of electrically conductive pads on the polymer layer such that each pad contacts a front side electrode through the corresponding via;

mating the detector element array to a multiplexer chip by connecting each pad on the detector array to circuitry on the multiplexer chip;

removing the substrate; and depositing an electrically conductive radiation absorbing layer on the first major surface of each pyroelectric detector element.

* * * * *